United States Patent [19]
Chern et al.

[11] Patent Number: 6,159,806
[45] Date of Patent: Dec. 12, 2000

[54] METHOD FOR INCREASING THE EFFECTIVE SPACER WIDTH

[75] Inventors: Horng-Nan Chern, Chia-Li Chen; Hsi-Chia Lin, Feng-Yuan; Kun-Chi Lin, Hsin-Chu, all of Taiwan

[73] Assignee: United Microelectronics Corp., Hsin-Chu, Taiwan

[21] Appl. No.: 09/473,985

[22] Filed: Dec. 29, 1999

[51] Int. Cl.7 .............................................. H01L 21/8234
[52] U.S. Cl. ........................................................... 438/275
[58] Field of Search .................................... 438/275, 276, 438/733, 290, 294, 299, 305, 306, 307, 396, 689, 706, 704, 735, 800

[56] References Cited

U.S. PATENT DOCUMENTS 5,656,533  8/1997  Lee .......................................... 438/396

*Primary Examiner*—Charles Bowers
*Assistant Examiner*—Craig Thompson

[57] ABSTRACT

A method for depositing an oxide layer after spacer formation is disclosed. Owing to an oxide layer after spacer formation, therefore substantially increasing the effective thickness of spacer of the peripheral circuit. The method includes which includes a substrate on which an interior and a peripheral circuit are defined, wherein there is a gate oxide layer formed on the substrate. Sequentially an interior gate and a peripheral gate are formed. Then, N-type ions are implanted into the substrate of the interior and peripheral circuit. Consequently, conformal a second dielectric layer and a third dielectric layer are deposited above the substrate, interior gate, and peripheral gate, wherein second dielectric layer is etched to form a spacer of the interior gate and the peripheral gate. And then $N^+$-type ions are implanted into the substrate to form source/drain by using the peripheral gate, the spacer and a portion of the third dielectric layer that runs along the spacer as a mask. Subsequently, a blanket inter-plasma dielectric is deposited above the substrate. Finally, inter-polysilicon dielectric of the interior and peripheral circuit is etched anisotropically to form a plurality of contacts.

22 Claims, 5 Drawing Sheets

METHOD FOR INCREASING THE EFFECTIVE SPACER WIDTH

BACKGROUND OF THE INVENTION

1. Field of the Invention

The present invention relates to a method for depositing an oxide layer after spacer formation. Owing to an oxide layer after spacer formation, therefore substantially increasing the effective spacer width of peripheral circuit, so that the provided high quality of semiconductor device.

2. Description of the Prior Art

Recently, demand for semiconductor devices has rapidly increased owing to widespread use of integrated electronic circuit. In particularly, as more than hundreds or thousands of electrical components are integrated into the ICs, a mean for higher quality of semiconductor device and more simplification fabrication has become imperative.

Manufacturers in the field of integrated circuits (ICs) have been trying to reduce the geometric size of the devices present on integrated circuits. The benefits achieved in reducing device dimensions include higher performance and smaller packaging sizes. However, numerous limitations arise as manufacturers attempt to achieve smaller and smaller device sizes. One primary problem manufacturer face is that as smaller devices are sought, the precision required from the tools used to create IC device increases.

Integrated circuits (ICs) have been trying to reduce the geometric size of the devices, so the pitch of gate to gate becomes smaller. In order to avoid the punchthrough in peripheral circuit, it needs to increase the spacer width. However, if the spacer width is increased, the width contacts of the follow-up process will become small because the pitch of gate to gate is unchanged. Nevertheless, the width contacts becomes small to result in increment of the RC impedance For the foregoing reasons, there is a need for a method of increasing the effective spacer width, but the contact width is not changed.

SUMMARY OF THE INVENTION

In accordance with the present invention, a method is provided for depositing an oxide layer after spacer formation. Owing to an oxide layer after spacer formation, therefore substantially increasing the effective spacer width of peripheral circuit, so that the provided high quality of semiconductor device.

Another purpose of the present invention is to provide an oxide layer after spacer formation, an oxide layer is deposited after spacer formation can increase the effective spacer width from original width to a larger width which is extended by the thickness of oxide layer, but the contact width is not changed.

In one embodiment, the present invention provides a method semiconductor device, which includes a substrate on which an interior and a peripheral circuit are defined, wherein there is a gate oxide layer formed on the substrate. Sequentially a polysilicon layer, a conductive layer, and a first dielectric layer are formed on the gate oxide layer. Moreover, patterning to etch the first dielectric layer, the conductive layer, the polysilicon layer, and the gate oxide layer to form an interior gate and a peripheral gate. Then, first ions are implanted into the substrate of the interior and peripheral circuit. Consequently, a second conformal dielectric layer is deposited above the substrate, interior gate, and peripheral gate, wherein second dielectric layer is etched to form a spacer of the interior gate and the peripheral gate. Next, a third conformal dielectric layer is deposited above the substrate. Moreover, a first photoresist layer is formed on the third dielectric layer of the interior circuit. And then second ions of the same conductive type as the first ions are implanted into the substrate to form source/drain by using the peripheral gate, the spacer and a portion of the third dielectric layer that runs along the spacer as a mask. The first photoresist layer is removed. Subsequently, a blanket inter-plasma dielectric is deposited above the substrate. Then, a second photoresist layer having first pattern is formed on the blanket inter-polysilicon dielectric of the interior circuit and second patterns on the blanket inter-polysilicon dielectric of the periphery circuit. Finally, inter-polysilicon dielectric of the interior and the peripheral circuit is etched anisotropically to form a plurality of contacts. Owing to an oxide layer after spacer formation, therefore substantially increasing the effective spacer width of the peripheral circuit, so that the provided high quality of semiconductor device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
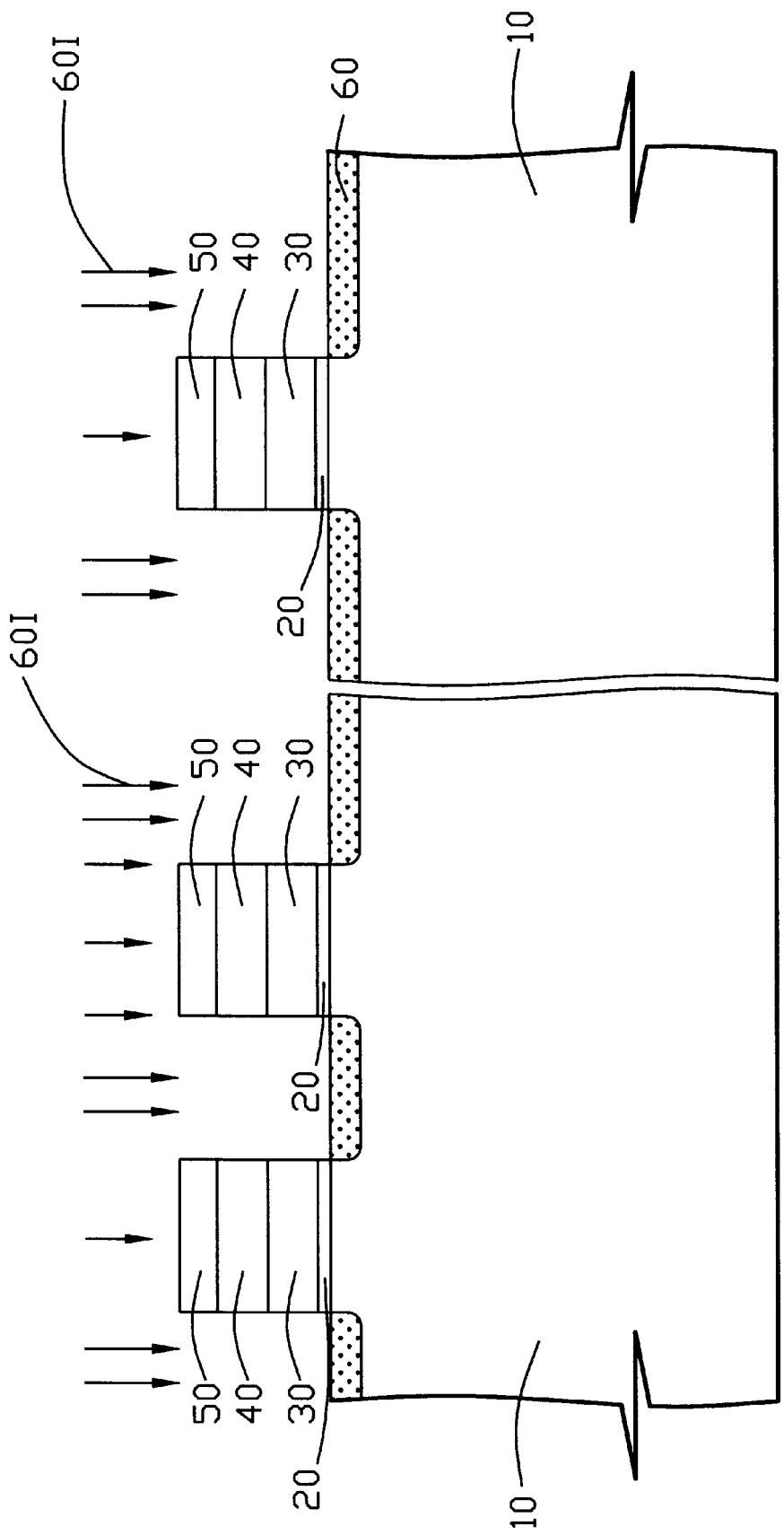
FIGS. 1 to 5 show cross-sectional views illustrative of various stages in the fabrication in accordance with one embodiment of the present invention.

Referring to FIG. 1, a silicon substrate 10 with p type conductivity is firstly provided, wherein a interior and a peripheral circuit are defined on the silicon substrate 10. It is appreciated that a semiconductor substrate with n type conductivity can also be used. However, it is appreciated that an n-type semiconductor substrate can be adapted. The substrate 10 is then placed into a furnace, and is subjected to a thermal oxidation, such as a dry oxidation process, thus forming a gate oxide layer 20 containing silicon oxide to a thickness of about 100–250 angstroms. Next, a standard low-pressure chemical vapor deposition (LPCVD) is applied to form a polysilicon layer 30 having a thickness of about 1000–3000 angstroms on the gate oxide layer 20. Generally, Arsenic or Phosphorus atoms are implanted or diffused into the polysilicon layer 30 to reduce its resistivity. Next, a conventional deposition technique, such as a standard low-pressure chemical vapor deposition (LPCVD) is performed to form a conductive layer 40, such as tungsten silicide layer ($WSi_x$), on the polysilicon layer 30. And then a sacrificial dielectric layer, such as first silicon nitride layer 50 is then formed on the tungsten silicide layer using, for example, a conventional low pressure chemical vapor deposition (LPCVD). The thickness of the first silicon nitride layer 50 is preferably about 1000–2000 angstrom. The most preferred thickness of the first silicon nitride layer 50 depends on the required dimension of the formed gate. A photoresist layer (no shown) is then formed and patterned on first silicon nitride layer 50 using conventional photolithography techniques, thereby defining interior gate and peripheral gate over a portion of the substrate 10. A gate structure is formed on the interior circuit and the peripheral circuit of silicon substrate 10 by anisotropically etched, for example, a conventional dry etch or reactive ion etch (RIE) technique. Moreover, using the interior gate and the peripheral gate as a doping mask, N-type ions 601 such as Arsenic with concentration of about $10^{13}/cm^2$ are implanted into the substrate 10, generally followed by a thermal driving in and annealing in a temperature of about 900–1000° C.

Figure 2:
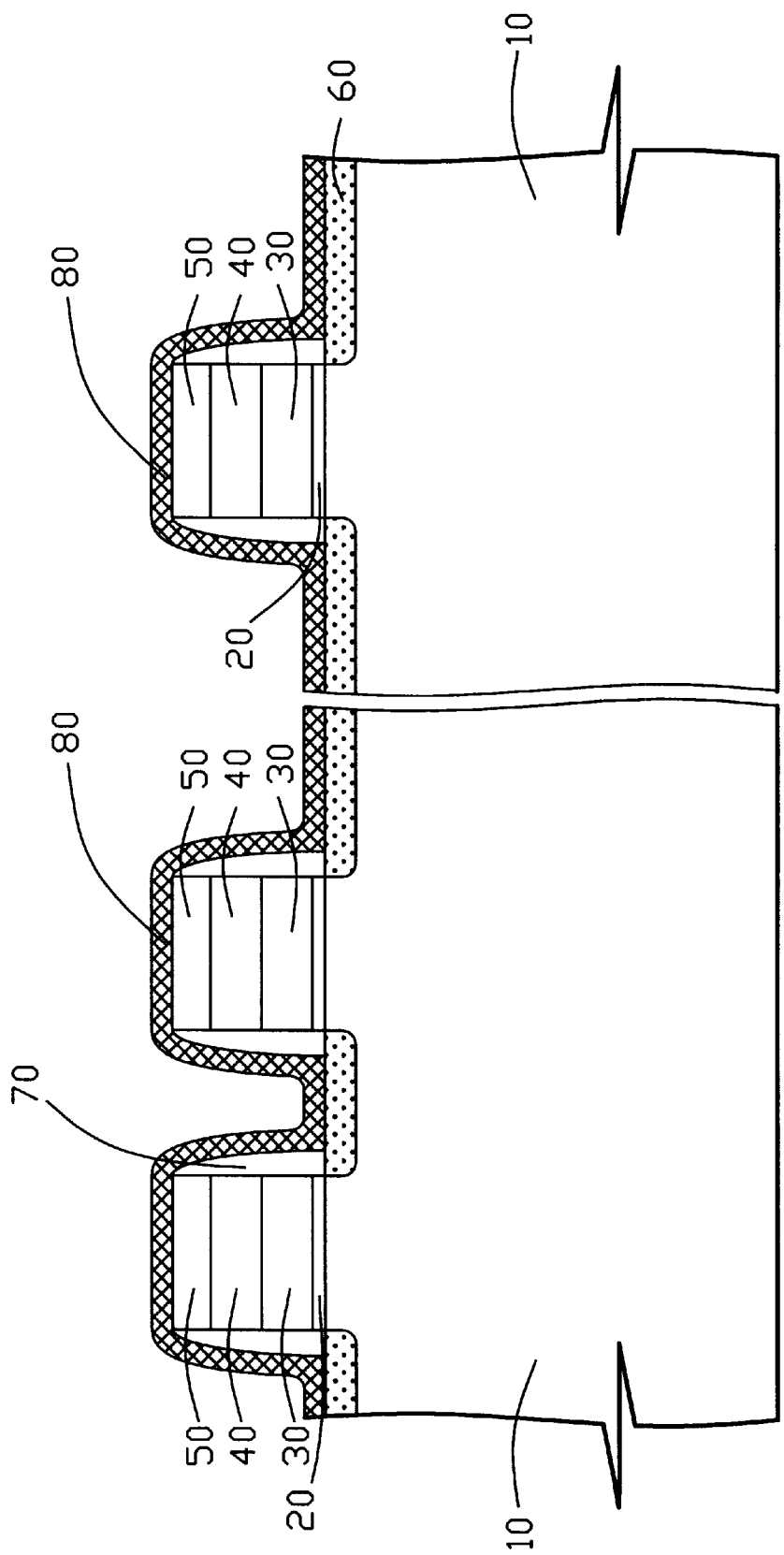

The cross-sectional view of FIG. 2 illustrates the second silicon nitride spacer 70 of the interior and the peripheral circuit are formed generally by firstly blanket depositing a second silicon nitride layer having thickness of about 1000–2000 angstroms, followed by etching back the silicon nitride layer. Moreover, an oxide layer 80 is deposited above the silicon substrate 10 by chemical vapor deposition, wherein the oxide layer 80 is formed around the interior gate and the peripheral gate, and then the thickness of the oxide layer 80 is about 150 angstrom.

Figure 3:
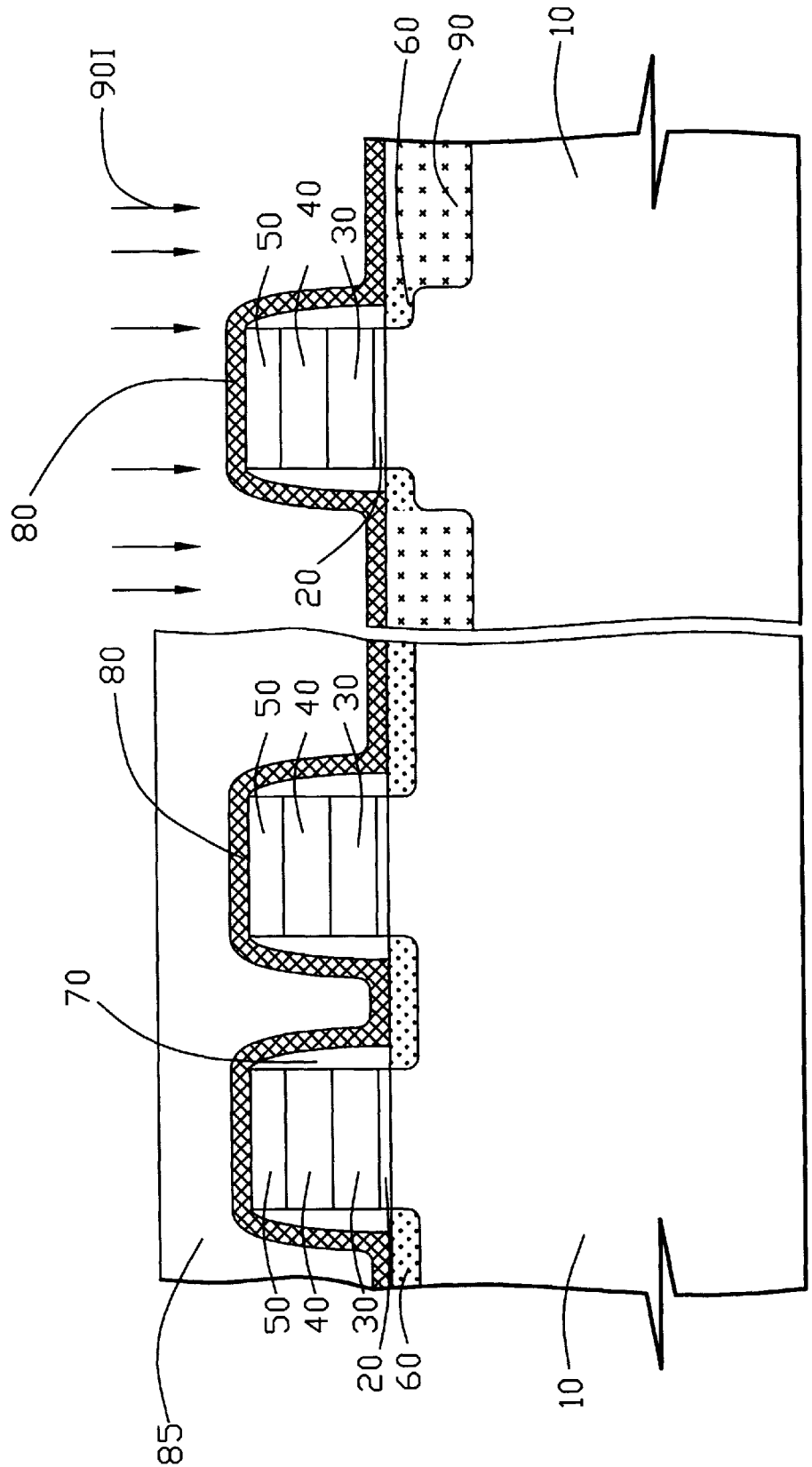

A blanket first photoresist layer 90 is deposited on the interior circuit as shown in FIG. 3. Subsequently, $N^+$-type 901 ions are implanted into the silicon substrate 10 of the peripheral circuit through the oxide layer to form source/drain by using the peripheral gate, the spacer and a portion of the oxide layer which runs along the spacer as a mask. Moreover, the first photoresist layer 85 above the interior circuit is removed. In one embodiment, the present invention is order to avoid the punchthrough in the peripheral circuit; it needs to increase the spacer width. However, if the spacer width is increased, the width contacts of the follow-up process will become small because the pitch of gate to gate is unchanged. Hence, an oxide layer is deposited after spacer formation can increase the effective spacer width from original width to a larger width which is extended by the thickness of oxide layer, but the contact width is not changed.

Figure 4:
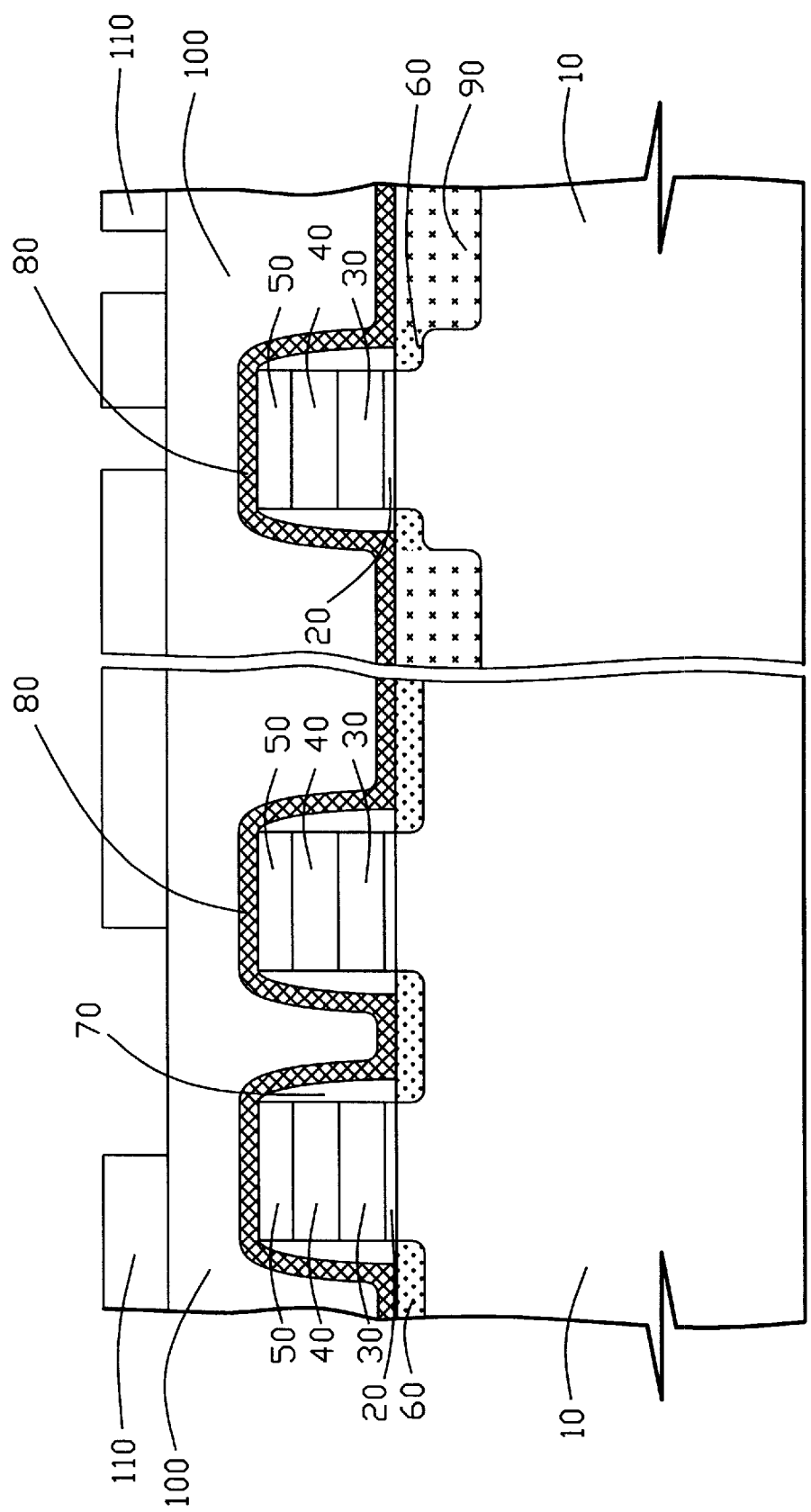
Figure 5:
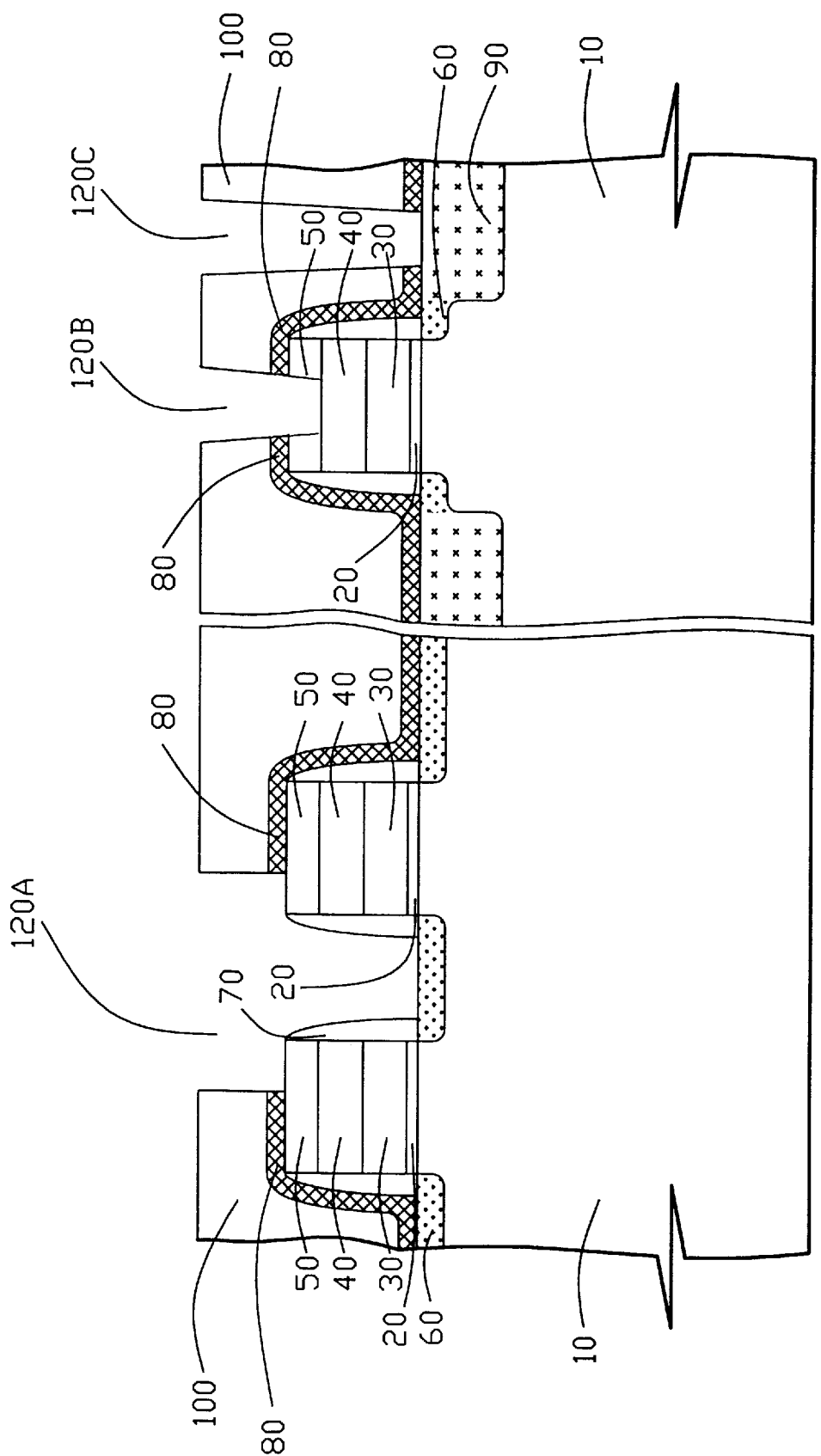

In the structure of FIG. 4, an inter-polysilicon dielectric 100 (IPD) such as silicon dioxide layer is deposited over the substrate 10 of the interior and the peripheral circuit. Sequentially, a second photoresist layer having first pattern is formed on the a blanket inter-polysilicon dielectric 100 of the interior circuit and second pattern on the a blanket inter-polysilicon dielectric 100 of the periphery circuit. Using conventional photolithography techniques to define a plurality of contacts, the inter-polysilicon dielectric layer 100 is then patterned and etched to form a plurality of contacts therein. Finally, referring to FIG. 5, a standard self-aligned reactive ion etch is applied to form a plurality of contacts, such as a node contact of the interior circuit 120A, a bit-line to gate 120B and a bit-line to substrate 120C of the peripheral circuit in the embodiment by anisotropically etched.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:

providing a substrate on which an interior and a peripheral circuit are defined, wherein there is a gate oxide layer formed on said substrate;

sequentially forming a polysilicon layer, a conductive layer, and a first dielectric layer on said gate oxide layer;

patterning to etch said first dielectric layer, said conductive layer, said polysilicon layer, and said gate oxide layer to form an interior gate and a peripheral gate;

implanting first ions into said substrate of the interior and the peripheral circuit;

conformal depositing a second dielectric layer above said substrate, interior gate and peripheral gate, wherein etching second dielectric layer to form a spacer of the interior gate and the peripheral gate;

conformal depositing third dielectric layer above said substrate of interior and a peripheral circuit, blanket forming a first photoresist layer on said third dielectric layer of the interior circuit;

implanting second ions of the same conductive type into said substrate of peripheral circuit to form a source/drain by using said peripheral gate, said spacer and a portion of said third dielectric layer which runs along said spacer as a mask;

removing the first photoresist layer;

blanket depositing an inter-polysilicon dielectric on the dielectric layer;

forming a second photoresist layer having first pattern on said a inter-polysilicon dielectric of interior circuit and second pattern on said a inter-polysilicon dielectric of periphery circuit; and anisotropically etching the inter-polysilicon dielectric of interior and peripheral circuit to form a plurality of contacts.

2. The method according to claim 1, wherein said conductive layer comprises tungsten silicide ($WSi_x$).

3. The method according to claim 1, wherein said first dielectric layer comprises silicon nitride.

4. The method according to claim 1, wherein said second dielectric layer comprises silicon nitride.

5. The method according to claim 1, wherein said third dielectric layer comprises silicon dioxide.

6. The method according to claim 1, wherein the thickness of said third dielectric layer is about 150 angstrom.

7. The method according to claim 1, wherein said third dielectric layer is deposited by chemical vapor deposition.

8. The method according to claim 1, wherein implanting dosage of second ions are greater than the first ions.

9. The method according to claim 1, wherein said a plurality of contacts comprises node contact, bit-line to gate and bit-line to substrate.

10. The method according to claim 1, wherein said first pattern of the second photoresist layer defines a node contact of interior circuit.

11. The method according to claim 1, wherein said second pattern of the second photoresist layer defines a bit-line to gate and bit-line to substrate of the peripheral circuit.

12. The method according to claim 1, wherein said inter-polysilicon dielectric comprises silicon dioxide.

13. A method for forming a semiconductor device, said method comprising:

providing a silicon substrate on which an interior and a peripheral circuit are defined, wherein there is a gate oxide layer formed on said silicon substrate;

sequentially forming a polysilicon layer, a tungsten silicide ($WSi_x$) layer, and a first silicon nitride layer on said gate oxide layer;

patterning to etch said first silicon nitride layer, said tungsten silicide ($WSi_x$) layer, said polysilicon layer, and said gate oxide layer to form an interior gate and a peripheral gate;

implanting N-type conductive ions into said silicon substrate of the interior and the peripheral circuit;

conformal depositing a second silicon nitride layer above said silicon substrate, interior gate and peripheral gate, wherein etching second silicon nitride layer to form a spacer of the interior gate and the peripheral gate;

conformal depositing a oxide layer above said silicon substrate of interior and a peripheral circuit;

blanket forming a first photoresist layer on said oxide layer of the interior circuit;

blanket forming a first photoresist layer on said oxide layer of the interior circuit;

implanting $N^+$-type conductive ions into said silicon substrate of peripheral circuit to form a source/drain by using said peripheral gate, said spacer and a portion of said oxide layer which runs along said spacer as a mask;

removing the first photoresist layer;

blanket depositing a inter-polysilicon dielectric above the substrate of interior and a peripheral circuit;

forming a second photoresist layer having first pattern on said inter-polysilicon dielectric of the interior circuit and second pattern on said inter-polysilicon dielectric of the periphery circuit; and anisotropically etching a portion of the inter-polysilicon dielectric and said second silicon nitride layer to form a plurality of contacts.

14. The method according to claim 13, wherein said etching of the polysilicon layer is done by a dry etch.

15. The method according to claim 14, wherein said dry etch comprises a reactive ion etch.

16. The method according to claim 13, wherein the thickness of said second silicon nitride layer is about 400 angstrom.

17. The method according to claim 13, wherein said second silicon nitride layer is deposited by chemical vapor deposition.

18. The method according to claim 13, wherein implanting dosage of $N^+$-type ions are greater than N-type ions.

19. The method according to claim 13, wherein said a plurality of contacts comprises node contact, bit-line to gate and bit-line to substrate.

20. The method according to claim 13, wherein said first pattern of the second photoresist layer defines a node contact of the interior circuit.

21. The method according to claim 13, wherein said second pattern of the second photoresist layer defines a bit-line to gate and bit-line to substrate of the peripheral circuit.

22. The method according to claim 13, wherein said inter-polysilicon dielectric comprises silicon dioxide.

* * * * *